United States Patent [19]
Komori et al.

[11] Patent Number: 5,407,853
[45] Date of Patent: Apr. 18, 1995

[54] METHOD OF MAKING SEMICONDUCTOR INTEGRATED CIRCUIT DEVICE HAVING SINGLE-ELEMENT TYPE NON-VOLATILE MEMORY ELEMENTS

[75] Inventors: Kazuhiro Komori, Higashikurume; Toshiaki Nishimoto, Tama; Satoshi Meguro, Hinode; Hitoshi Kume, Musashino; Yoshiaki Kamigaki, Tokorozawa, all of Japan

[73] Assignee: Hitachi, Ltd., Tokyo, Japan

[21] Appl. No.: 179,960

[22] Filed: Jan. 11, 1994

Related U.S. Application Data

[60] Division of Ser. No. 704,739, May 20, 1991, Pat. No. 5,300,802, which is a continuation of Ser. No. 433,983, Nov. 9, 1989.

[30] Foreign Application Priority Data

Nov. 9, 1988 [JP] Japan ................... 63-284587

[51] Int. Cl.⁶ ......................... H01L 21/70
[52] U.S. Cl. ..................... 437/52; 437/43; 437/44; 437/48
[58] Field of Search ............ 437/43, 44, 48, 52

[56] References Cited

U.S. PATENT DOCUMENTS

| | | | |
|---|---|---|---|
| 4,376,947 | 3/1983 | Chiu et al. | 357/23.5 |
| 4,665,418 | 5/1987 | Mizutani | 357/23.5 |
| 4,698,787 | 10/1987 | Mukherjee et al. | 357/23.5 |
| 4,784,966 | 11/1988 | Chen | 357/42 |
| 4,804,637 | 2/1989 | Smayling et al. | 357/23.5 |
| 4,835,740 | 5/1989 | Sato | 357/23.5 |
| 4,859,619 | 8/1989 | Wu et al. | 357/23.5 |
| 4,972,371 | 11/1990 | Komori et al. | 357/23.5 |
| 5,079,603 | 1/1992 | Komori et al. | 357/23.5 |
| 5,153,144 | 10/1992 | Komori et al. | 437/48 |
| 5,340,760 | 8/1994 | Komori et al. | 437/43 |

FOREIGN PATENT DOCUMENTS

| | | | |
|---|---|---|---|
| 0286121 | 10/1988 | European Pat. Off. | 357/23.5 |
| 54-156483 | 12/1979 | Japan | 357/23.5 |
| 56-69866 | 6/1981 | Japan . | |
| 61-32478 | 2/1986 | Japan | 357/23.5 |
| 62-98765 | 5/1987 | Japan | 357/23.6 |
| 62-276878 | 12/1987 | Japan . | |
| 0301566 | 12/1988 | Japan . | |
| 0102073 | 6/1992 | Japan . | |

OTHER PUBLICATIONS

"A Single Transistor EEPROM Cell and Its Implementation in a 512K CMOS EEPROM", 1985 IEDM Tech. Dig., pp. 616–619, by S. Mukherjee, et al.

IEEE Sponsored IEDM87 publication article entitled "A Flash-Erase EEPROM Cell with an Asymmetric Source and Drain Structure", by H. Kume, et al., IEDM 1987, 25.8, pp. 560–563.

*Primary Examiner*—Tom Thomas
*Attorney, Agent, or Firm*—Antonelli, Terry, Stout & Kraus

[57] ABSTRACT

A semiconductor integrated device having a non-volatile memory element or memory cell of a single-element type in a non-volatile memory circuit employing a field effect transistor which has, in addition to a floating gate electrode for storage of information and a controlling gate electrode, a source which includes a heavily doped region having a depth into the semiconductor substrate extending from the major surface thereof which is large. The single-element type field effect transistor, furthermore, has a drain which includes a lightly doped region which has a depth extending into the semiconductor substrate from the major surface thereof which is small.

18 Claims, 6 Drawing Sheets

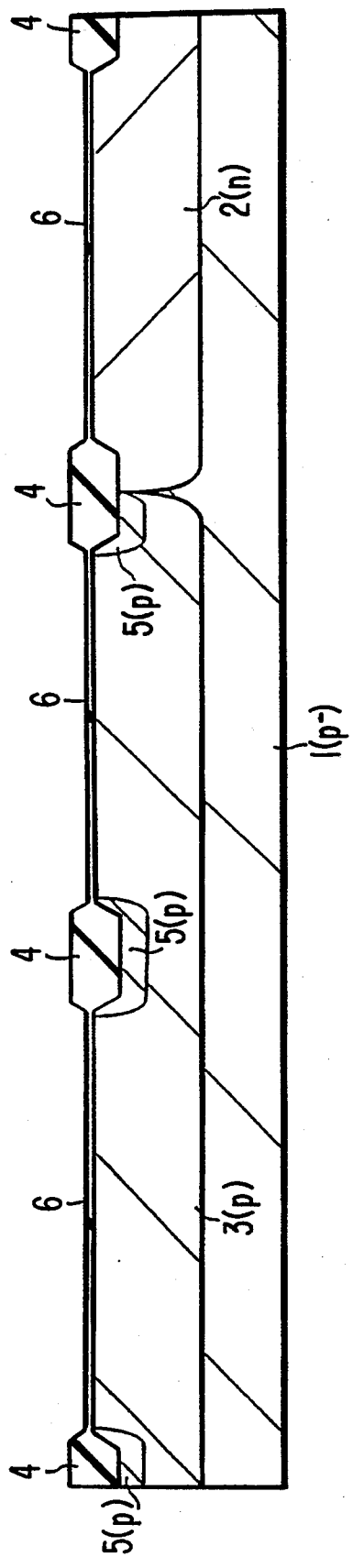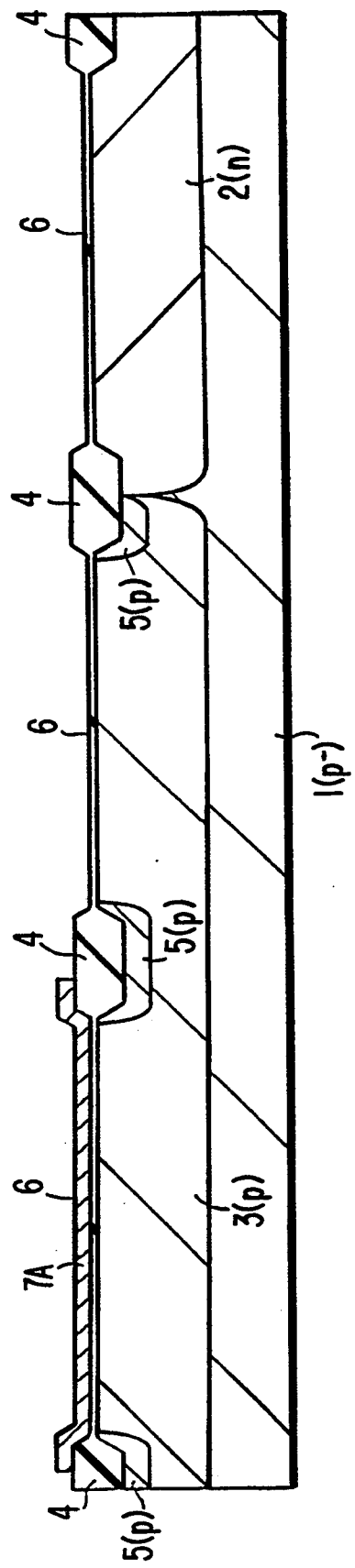

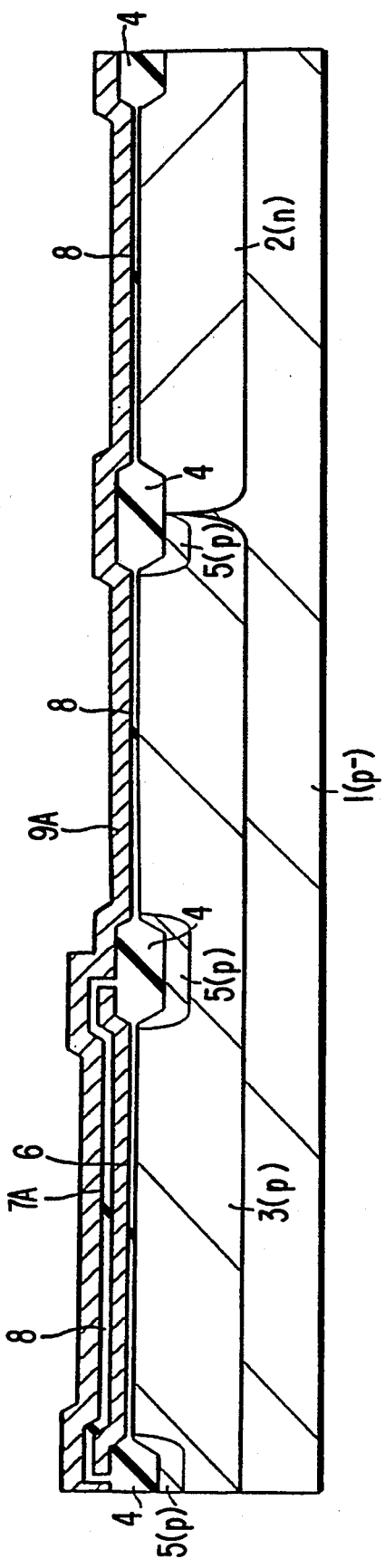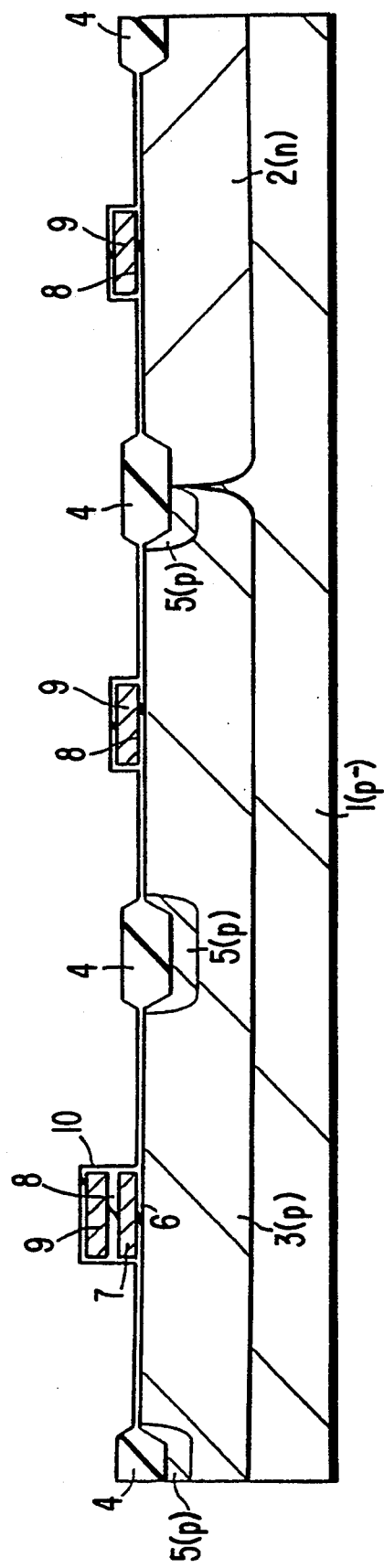

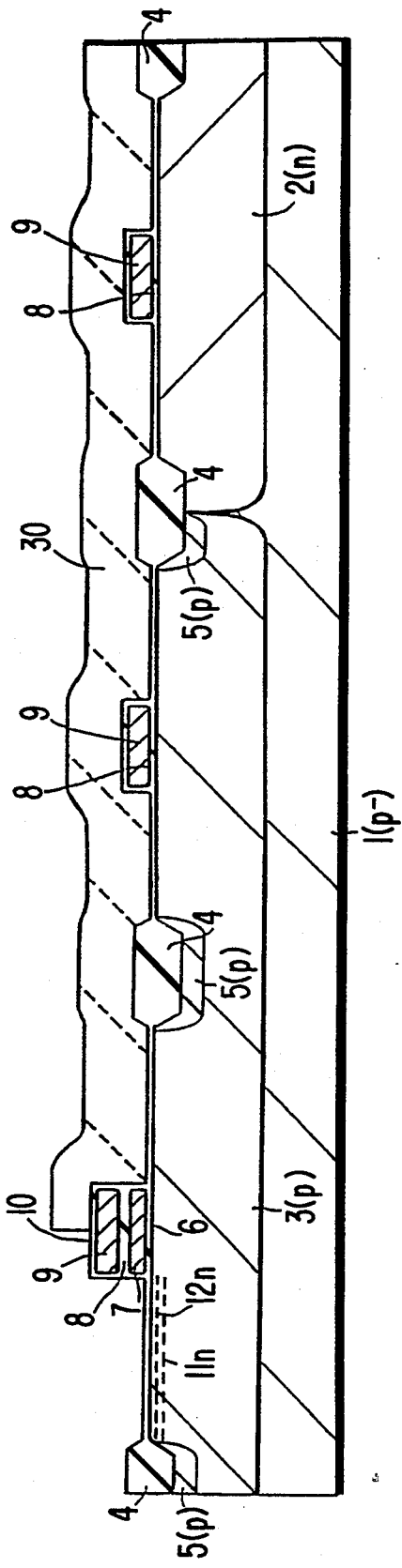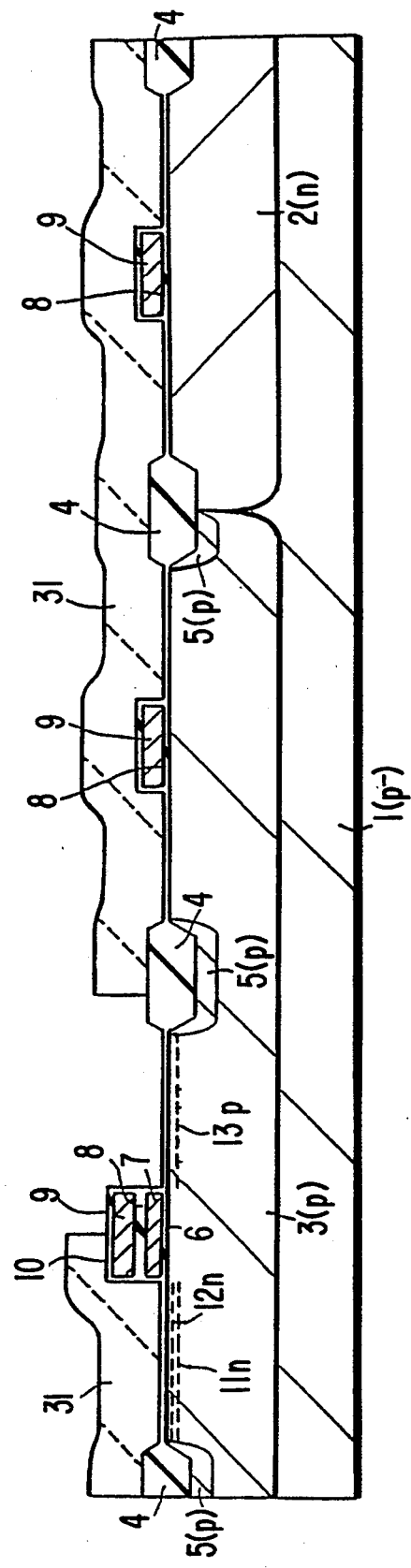

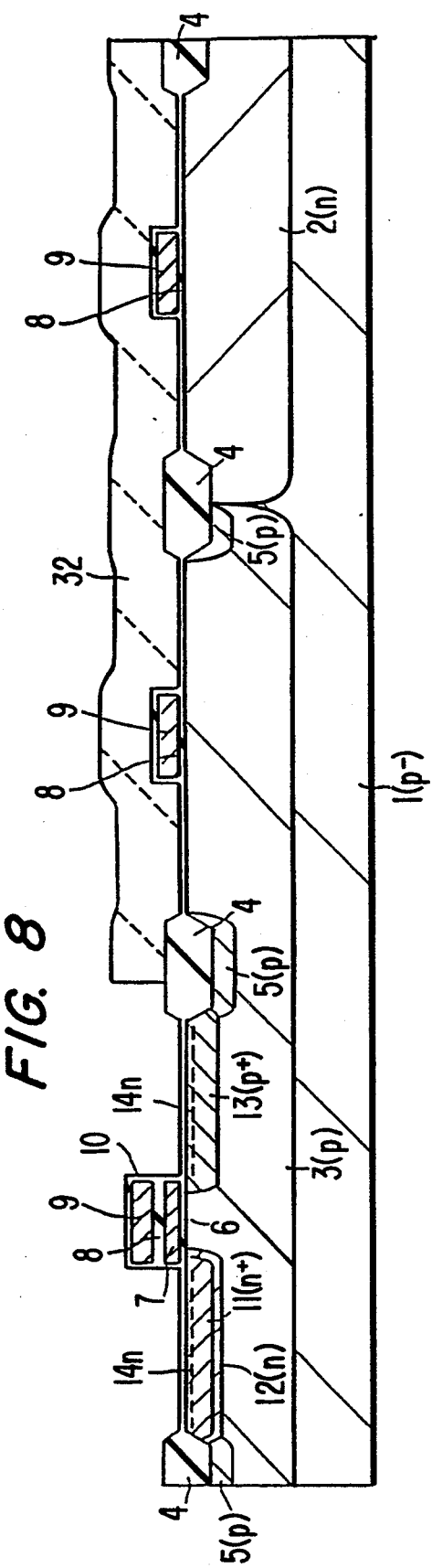
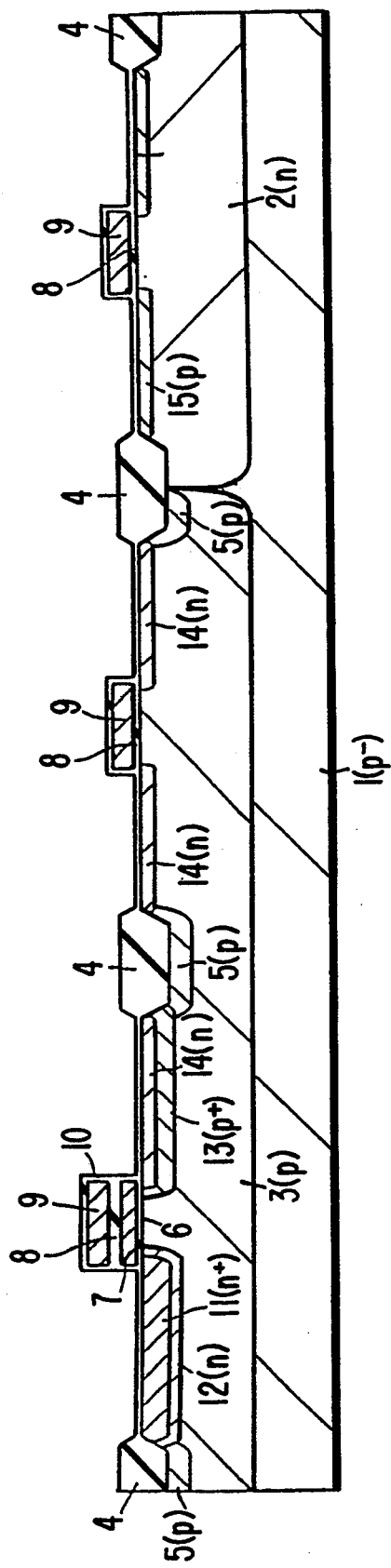

METHOD OF MAKING SEMICONDUCTOR INTEGRATED CIRCUIT DEVICE HAVING SINGLE-ELEMENT TYPE NON-VOLATILE MEMORY ELEMENTS

This is a divisional of application Ser. No. 07/704,739, filed May 20, 1991, now U.S. Pat. No. 5,300,802; which is a continuation of application Ser. No. 07/433,983, filed Nov. 9, 1989, now abandoned.

BACKGROUND OF THE INVENTION

1. Field of the Invention

The present invention relates to a semiconductor integrated circuit device and method of implementing the device and, in particular, to a technique for effectively implementing a semiconductor integrated circuit device having a non-volatile memory circuit, such as, in an Electrically Erasable Programmable Read Only Memory, for example, which employs single-element type field effect transistors as non-volatile memory elements.

2. Description of Related Subject Matter

A single-element type non-volatile memory element (memory cell) has been proposed as a non-volatile memory element in an Electrically Erasable Programmable Read Only Memory (EEPROM or E$^2$PROM). This non-volatile memory element (memory cell) is constituted by a field effect transistor having one gate electrode for the storage of information (a floating gate electrode) and another gate electrode as a control electrode thereof (a controlling gate electrode). The source region of the field effect transistor is connected to a source line, while the drain region thereof is connected to a data line.

The aforesaid non-volatile memory element, which is called a flash type non-volatile memory element, is constituted as being both a hot electron writing type and a tunnel erasing type. In other words, the information writing operation of the non-volatile memory element is performed by generating hot electrons in a high electric field near the drain region and injecting the hot electrons into the information storing gate electrode. On the other hand, the information erasing operation of the non-volatile memory element is performed by tunnel-discharge of the electrons stored in the information storing gate electrode to the source region.

An EEPROM which is constituted by such a flash type non-volatile memory element consisting of a single-element type memory cell, as noted above, makes it possible to reduce the cell area and, as such, this memory can be characterized as being able to attain a high integration density.

The aforementioned EEPROM is described in the publication 1985 IEDM Tech. Dig., on pp. 616–619 thereof, in an article entitled "A Single Transistor EEPROM Cell and Its Implementation in a 512K CMOS EEPROM."

Having studied the above-mentioned EEPROM, the present inventors found that the following problems were evident or associated therewith.

(1) In order to improve the information erasing efficiency in the foregoing information erasing operation of the flash type non-volatile memory element, it is necessary to make the impurity concentration of the source region high and the junction depth thereof large. That is, if the impurity concentration of the source region is made high, it is possible to decrease the surface depletion of the source region and decrease the voltage drop of the same surface thereby making it possible to increase the amount of tunneling current. Further, if the junction depth of the source region is made large, the amount of diffusion of the source region to the channel-forming region side increases, the overlap area of the source region and the information storing gate electrode correspondingly increases and the tunneling area also increases, so that the amount of tunneling current can be increased. However, since the source and drain regions are formed during the same manufacturing process, the drain region, furthermore, also becomes high in impurity concentration and large in junction depth. That is, the coupling capacitance associated therewith increases because of an increase in the overlap area of the drain region and the information storing gate electrode. Consequently, in the information writing operation, an unselected memory cell, which has its controlling gate electrode connected to ground (biased at ground potential) and a drain electrode which is biased at a high potential, increases in potential at its information storing gate electrode because of the foregoing coupling capacitance, and the memory cell becomes conductive, so that the flow of leakage current occurs thereby resulting in a deterioration of the information writing characteristic of a selected memory cell.

(2) With an increase in impurity concentration of the drain region, the intensity of the electric field near the drain region becomes high. In the information writing operation, therefore, at a non-volatile memory element which is in an unselected state after having undergone a writing operation and which has been biased with a high potential only at its drain electrode, hot holes are generated thereby erasing the information which may have been previously stored and deteriorating its electrical reliability. Further, if the drain region is high in impurity concentration and large in junction depth, then in the information writing operation, at a non-volatile memory element which is in an unselected state after having undergone a writing operation and which has been biased with a high potential only at its drain electrode, it becomes easier for tunneling to occur between the information storing gate electrode and the drain region thereof which can effect an erroneous erasing operation which leads to deterioration of its electrical reliability.

(3) If the impurity concentration of the drain region is high and the junction depth thereof becomes large, the parasitic capacitance applied to the data line increases. Consequently, the speed of the information reading operation decreases, thus making it impossible to effect speed-up of the operation speed.

(4) The above problem (1) may be solved by making the channel length large to effectively reduce the coupling capacitance formed between the drain region and the information storing gate electrode. However, since an increase in the channel length would result in an increase in the area occupied by the non-volatile memory element, any attempt at attaining high integration would thus become an impossibility.

SUMMARY OF THE INVENTION

It is an object of the present invention to provide a technique which permits improvement of not only the information erasing efficiency but also the information writing characteristic in a semiconductor integrated circuit device having a non-volatile memory circuit.

It is another object of the present invention to provide a technique which permits improvement of electrical reliability in the above semiconductor integrated circuit device.

It is a further object of the present invention to provide a technique capable of attaining speed-up of the operation speed in the above semiconductor integrated circuit device.

It is a still further object of the present invention to provide a technique capable of decreasing the number of manufacturing steps required for the above semiconductor integrated circuit device.

A typical example of the invention disclosed in the present application will now be summarized.

In a semiconductor integrated circuit device having a non-volatile memory circuit, such as, constituted by a flash type non-volatile memory element which employs an additional gate as a floating gate, for example, the source region of a field effect transistor constituting the non-volatile memory element is high in its impurity concentration (heavily doped) and large in its junction depth, while the drain region of the said field effect transistor is low in its impurity concentration (lightly doped) and small in its junction depth.

According to the above means:

(1) Since the impurity concentration of the source region of the field effect transistor serving as the non-volatile memory element is made high, it is possible to reduce the surface depletion of the source region in the information erasing operation and decrease the voltage drop at the surface of the source region, thus making it possible to increase the amount of tunneling current and improve the information erasing efficiency.

(2) Since the junction depth of the above source region is made large, furthermore, it is possible to increase the amount of diffusion of the source region to the channel-forming region side and increase the overlap area of the source region and the information storing gate electrode to increase the tunneling area, thus permitting an increase of the amount of tunneling current and thus an improvement of the information erasing efficiency.

(3) Since the impurity concentration of the above drain region is made low, it is possible to lower the intensity of the electric field induced near the above drain region and corresponding decrease the generation of hot holes, so that during the information writing operation it is possible to prevent erasing of information which has already been written in a presently unselected, non-volatile memory element, thus permitting an improvement of the electrical reliability thereof. Moreover, since the impurity concentration of the drain region is made low, it becomes easier for surface depletion to occur, so it is possible to decrease the amount of tunneling current and prevent erasing of the information already written in the memory element (memory cell).

(4) Since the junction depth of the above drain region is made small, it is possible to decrease the amount of diffusion of the drain region to the channel-forming region side and decrease the overlap area of the drain region and the information storing gate electrode which would correspondingly decrease the coupling capacitance between the drain region and the information storing gate electrode. Consequently, in the information writing operation it is possible to prevent a memory cell which is to remain in an unselected state from undesirably becoming conductive. As a result, therefore, the leakage of current associated with the written or stored information in the memory element or cell is prevented, thereby permitting improvement of the information writing characteristic.

(5) By making the above drain region low in its impurity concentration and small in its junction depth, it is possible to also decrease the parasitic capacitance added to the data line and correspondingly increase the speed of the information reading operation, so it is possible to attain speed-up of operation.

(6) Since the channel length of the non-volatile memory element can be reduced as a result of a decrease of the coupling capacitance mentioned in (4) above, it is possible to reduce the cell area and thereby attain higher integration.

The above and other objects and improved aspects of the present invention will become apparent from a detailed description of the invention in conjunction with the accompanying drawings.

The construction of the present invention described below will be in conjunction with an embodiment thereof which is applied to a semiconductor integrated circuit device having an EEPROM constituted by a flash type non-volatile memory element.

BRIEF DESCRIPTION OF THE DRAWINGS

FIGS. 2 to 10 are sectional views of the principal portion, showing manufacturing steps respectively of an EEPROM which employs a non-volatile memory element and, associated with peripheral circuitry thereof, p-channel type and n-channel type MISFETs, of the embodiment of the present invention illustrated in FIG. 1.

DETAILED DESCRIPTION OF THE PREFERRED EMBODIMENTS

Figure 1:
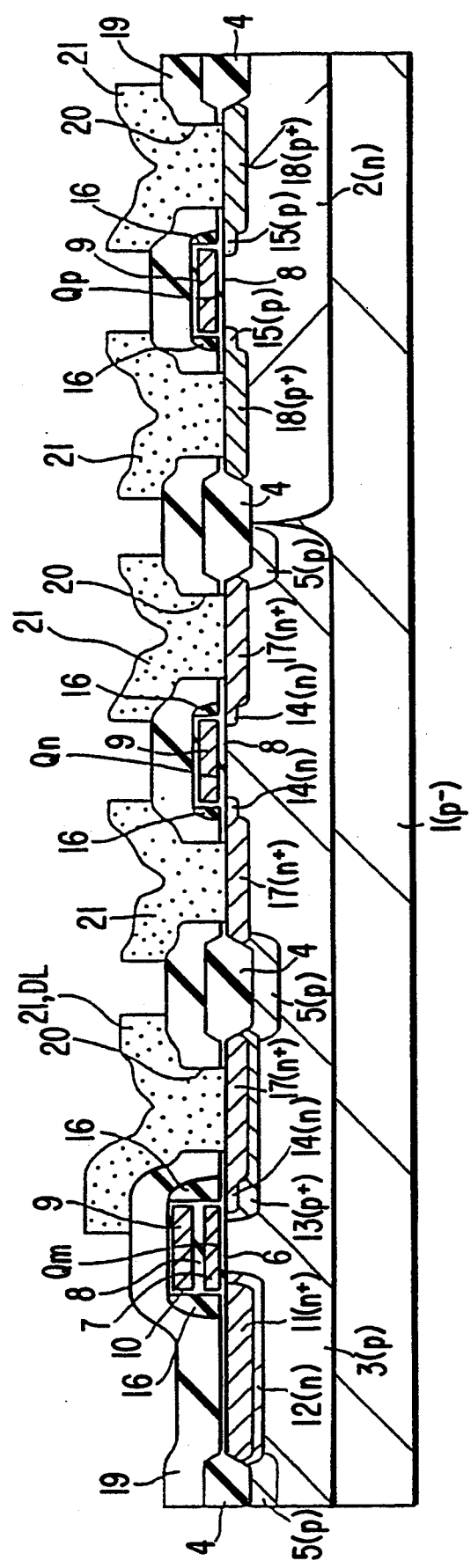
FIG. 1 is a sectional view of a principal portion, showing the construction of an EEPROM non-volatile memory element and complementary channel MISFETs according to an embodiment of the present invention.

In all the drawing illustrations of the embodiment, the portions having the same functions are indicated by the same numerals or legends and thereby repeated explanations thereof will be omitted.

The construction of an EEPROM according to an embodiment of the present invention is shown in conjunction with a sectional view of a principal portion thereof illustrated in FIG. 1, in which a flash type non-volatile memory element is shown on the left side and peripheral circuit components are shown on the right side thereof.

As shown in FIG. 1, the EEPROM is constituted by a $p^-$-type semiconductor substrate 1 formed of a single crystal silicon having a major (principal) surface. Non-volatile memory elements, such as the flash type non-volatile memory element Qm, and n-channel MISFETs, such as n-channel MISFET Qn, are formed in a p-type well region 3 which is provided in a major surface portion of the semiconductor substrate 1, while in those regions wherein p-channel MISFETs are formed, such as p-channel MISFET QP, an n-type well region 2 is provided in another part of the major surface portion of the semiconductor substrate 1.

Between the element forming regions, an insulating film 4 for element isolation is provided on the major surface portion associated with each of the n- and p-type well regions 2, 3. In the major surface portion of the p-type well region 3, there is provided a p-type channel stopper region 5 formed under or beneath the insulating film 4 which is for effecting element isolation.

The flash type non-volatile memory element Qm is constituted on the major surface portion of the p-type well region 3 in the area defined by the insulating film 4 (field oxide film), for element isolation, and the channel stopper region 5. More specifically, the flash type non-volatile memory Qm is composed of the p-type well region 3, a first gate insulating film 6, an information storing first gate electrode (floating gate electrode) 7, a second gate insulating film 8, a controlling second gate electrode 9, and source and drain regions. This flash type non-volatile memory element Qm is constituted by an n-channel field effect transistor and is a one-element type.

The p-type well region 3 is used as a channel forming region.

The gate insulating film 6 is a silicon oxide film formed by oxidizing the surface of the p-type well region 3. It has a thickness of, say, 100 to 150 Å (angstrom units).

The information storing gate electrode 7 is formed by a polycrystalline silicon film incorporating therein an n-type impurity, for example.

The gate insulating film 8 is formed, for example, by a silicon oxide film obtained by oxidizing the surface of the information storing gate electrode 7 (a polycrystalline silicon film). It has a thickness of, say, 200 to 250 Å.

The controlling gate electrode 9 is formed, for example, by a polycrystalline silicon film incorporating an n-type impurity therein. It may be formed by a single layer of a high-melting metal film or a high-melting metal silicide film or by a composite film obtained by laminating those metallic films on a polycrystalline silicon film. The controlling gate electrode 9 is constituted integrally with the controlling gate electrode 9 of another flash type non-volatile memory element Qm disposed adjacent in the gate width direction thereof, constituting a word line WL.

The source region is constituted by both an n+-type semiconductor region 11 of a high impurity concentration and an n-type semiconductor region 12 of a low impurity concentration. The n-type semiconductor region 12 is formed along the outer periphery of an n+-type semiconductor region 11. That is, the source region is of a so-called double diffusion structure. The n+-type semiconductor region 11 of a high impurity concentration is constituted mainly for increasing the impurity concentration and making the junction depth large. The n-type semiconductor region 12 is constituted mainly for making the junction depth large. Thus, in the source region, the impurity concentration is raised by the n+-type semiconductor region 11 in order to prevent surface depletion when high voltage is applied between the source region and the controlling gate electrode 9 at the time of information erasing operation. In the source region, moreover, by either the n+-type semiconductor region 11 of a high impurity concentration or the n-type semiconductor region 12 of a low impurity concentration or by both, the amount of diffusion (diffusion length) to the channel forming region side is increased and the overlap area (overlap quantity) with the information storing gate electrode 7 is increased which results in an increase of the tunneling area in the information erasing operation. The semiconductor regions 11 and 12 are, furthermore, formed in self-alignment with respect to the gate electrodes 7 and 9.

The drain region thereof is composed of an n-type semiconductor region 14 of a low impurity concentration and an n+-type semiconductor 17 of a high impurity concentration. The n-type semiconductor region 14 of a low impurity concentration in this drain region is constituted to control, particularly, the information writing characteristic of the flash type non-volatile memory element Qm. This n-type semiconductor region 14 is low in impurity concentration and small in junction depth as compared with the n+-type semiconductor region 11 of a high impurity concentration in the source region. In the writing operation, however, its concentration permits sufficient generation of hot electrons. More specifically, the drain region is constituted so that at the time of writing operation, in a selected memory element, the generation of hot electrons is maintained by the n-type semiconductor region 14 of a low impurity concentration, while in an unselected memory element the intensity of electric field near the drain region is reduced to diminish the generation of hot holes in the flash type non-volatile memory element. Also, the drain region is constituted so that it can decrease the amount of diffusion to the channel-forming region side mainly in the n-type semiconductor region 14 which is of a small junction depth, reduce the overlap area with the information storing gate electrode 7 and decrease the coupling capacitance formed between the drain region and the information storing gate electrode 7. The n-type semiconductor region 14 is formed by self-alignment with respect to the gate electrodes 7 and 9. The n+-type semiconductor region 17 is formed by self-alignment with respect to a side wall spacer 16 which in turn is formed by self-alignment with respect to the gate electrodes 7 and 9.

In the major surface portion of the semiconductor substrate 1 located along the outer periphery of the drain region there is formed a p+-type semiconductor region 13 of a high impurity concentration. The p+-type semiconductor region 13 is constituted so that it can enhance the intensity of electric field near the drain region, particularly, in order to promote the generation of hot electrons in the flash type non-volatile memory element Qm when it is in a selected state at the time of information writing operation and thereby improve the information writing efficiency.

A line (data line DL) 21 is connected to the n+-type semiconductor region 17 which serves as the drain region of the flash type non-volatile memory element Qm. The line 21 is formed over (on) an inter-layer insulating film 19 and is connected to the n+-type semiconductor region 17 through a connection or through-hole 20 formed in the inter-layer insulating film 19. For example, the line 21 is formed by an aluminum alloy film.

An example of operation voltages used in each of the information writing, reading and erasing operations of the flash type non-volatile memory element Qm are shown in Table 1 which follows.

TABLE 1

| | Operation of flash type non-volatile memory element Qm | | | | |
|---|---|---|---|---|---|
| | Information writing operation | | Information reading operation | | Information erasing operation |
| | Selected | Unselected | Selected | Unselected | |
| Control gate | 12 [V] | 0 or 12 [V] | 5 [V] | 0 or 5 [V] | 0 [V] |
| Data line | 7 [V] | 0 or 7 | 1 [V] | 0 or 1 | OPEN |

TABLE 1-continued

| Operation of flash type non-volatile memory element Qm | | | | |
|---|---|---|---|---|
| Information writing operation | | Information reading operation | | Information erasing operation |
| Selected | Unselected | Selected | Unselected | |
| or Drain region | [V] | | [V] | |
| Source line or Source region | 0 [V] | 0 [V] | 0 [V] | 0 [V] | 12 [V] |

Peripheral circuit components, e.g. a decoder circuit, in an EEPROM having components as exemplified in FIG. 1 of the drawings and discussed above, is constituted by a complementary MISFET (CMOS), although it is not to be construed as being limited thereto. In such a CMOS arrangement, an n-channel MISFET Qn is dimensionally defined by an outer periphery bordered by the insulating film 4, which is for element isolation, and the channel stopper region 5, and which n-channel MISFET Qn is constituted on a part of the major surface of the p-type well region 3. More specifically, the n-channel MISFET Qn is composed of the p-type well region 3, gate insulating film 8, gate electrode 9, and n and n+-type semiconductor regions 14 and 17, respectively, formed as individual pairs of adjacent regions serving as source and drain regions. The n-channel MISFET Qn has a lightly droped drain (LDD) structure and the line 21 is connected to the n+-type semiconductor regions 17 of this MISFET Qn.

In such a CMOS arrangement, the p-channel MISFET Qp is defined dimensionally as having an outer periphery bordered by the insulating film 4, which is for element isolation, and is, furthermore, constituted on the major surface of the n-type well region 2. More specifically, the p-channel MISFET Qp is composed of the n-type well region 2, gate insulating film 8, gate electrode 9, and p and p+-type semiconductor regions 15 and 18, respectively, formed as individual pairs of adjacent regions serving as source and drain regions. The p-channel MISFET Qp has an LDD structure and the line 21 is connected to the p+-type semiconductor regions 18 of this MISFET Qp.

The method employed in implementing the EEPROM described above will be described below briefly with reference to FIGS. 2 to 10 which illustrate sectional views during the manufacturing steps of the major surface portion illustrated in FIG. 1.

First, the p−-type semiconductor substrate 1 is prepared.

Then, in the forming region of the p-channel MISFET Qp, an n-type well region 2 is formed on the major surface portion of the semiconductor substrate 1. The foregoing p-type well region 3 is formed at an impurity concentration of, say, $2 \times 10^{16}$ to $3 \times 10^{16}$ atoms/cm$^3$. Thereafter, in each of the regions wherein a flash type non-volatile memory element Qm and n-channel MISFET Qn are to be formed, a p-type well region 3 is formed on the major surface portion of the semiconductor substrate 1.

Then, an insulating film 4 (field oxide film) for element isolation is formed on the major surface of each of the n- and p-type well regions 2, 3, and p-type channel stopper regions 5 are formed so as to surround the sides and undersides thereof in only those regions 4 or portions thereof disposed in the major surface portion of the p-type well region 3.

Next, in the semiconductor element forming region of the semiconductor substrate, a first gate insulating film 6 is formed on the major surface of each of the n- and p-type well regions 2, 3, as shown in FIG. 2.

Next, a first electroconductive film 7A is formed on the whole substrate surface including the upper surfaces of the gate insulating films 6. The electroconductive film 7A is formed by a polycrystalline silicon film deposited by a CVD method, for example. Into this polycrystalline silicon film is introduced an n-type impurity, e.g. phosphorus, to thus lower the resistance thereof. Thereafter, the electroconductive film 7A is patterned into a predetermined shape, as shown in FIG. 3. The electroconductive film 7A remains, therefore, only in the region of the major surface wherein the flash type non-volatile memory element Qm is formed, whereby the size thereof in the channel width direction is defined.

Next, in the region wherein the flash type non-volatile memory element Qm is formed there is formed a second gate insulating film 8 on the surface of the electroconductive film 7A. By a manufacturing step substantially the same as this step, a second gate insulating film 8 is formed on the major surface of each of the p-type well regions 3 corresponding to the n-channel MISFET Qn forming regions of the semiconductor substrate and on the major surface of each of the n-type well regions 2 corresponding to the p-channel MISFET Qp forming regions of the semiconductor substrate. Thereafter, as shown in FIG. 4, a second electroconductive film 9A is formed on the entire semiconductor substrate major surface including the upper surfaces of the gate insulating films 8. The electroconductive film 9A is formed by a polycrystalline silicon film deposited by a CVD method, for example. Into this polycrystalline silicon film is introduced an n-type impurity, e.g. phosphorus, to effectively reduce the resistance thereof.

Then, in the region wherein the flash type non-volatile memory element Qm is formed, the second and first electroconductive films 9A and 7A are patterned successively so as to form a controlling gate electrode 9 and an information storing gate electrode 7. This patterning is performed by a so-called lap-cut technique using anisotropic etching such as RIE. Thereafter, the electroconductive film 9A in the peripheral circuit component forming region is subjected to patterning to form a gate electrode 9. Subsequently, the whole substrate surface is subjected to an oxidation treatment to form a third insulating film 10 which covers the gate electrodes 7 and 9, as shown in FIG. 5. The insulating film 10 is formed mainly for improving the characteristic of holding the information stored in the information storing gate electrode 7 of the flash type non-volatile memory element Qm.

Next, there is formed an impurity introducing mask 30 having an opening for the formation of the source region of the flash type non-volatile memory element Qm. The impurity introducing mask 30 is formed by a photoresist film, for example. Thereafter, as shown in FIG. 6, n-type impurities 12n and 11n are introduced successively into the major surface portion of the p-type well region 3, serving as the source region forming area. The introducing order of the n-type impurities 12n and 11n may be reversed. For example, the n-type impurity 12n is introduced by an ion implantation method using phosphorus ion at an impurity concentration of $1\times10^{14}$ to $1\times10^{15}$ atoms/cm$^2$ and using about 50 KeV energy, while the n-type impurity 11n is introduced by an ion implantation method using arsenic ion at an impurity concentration of $5\times10^{15}$ to $1\times10^{16}$ atoms/cm$^2$ and using about 60 KeV energy. The n-type impurities 11n and 12n are introduced by self-alignment with respect to the information storing gate electrode 7 and the controlling gate electrode 9, using the same impurity introducing mask 30. Then, the mask 30 is removed.

Then, there is formed an impurity introducing mask 31 having an opening for the formation of the drain region of the flash type non-volatile memory element Qm. The impurity introducing mask 31 is formed by a photoresist film, for example. Thereafter, as shown in FIG. 7, a p-type impurity 13p is introduced into the major surface portion of the p-type well region 3 serving as the drain region forming area, using the impurity introducing mask 31. For example, the p-type impurity 13p is introduced by an ion implantation method using BF$_2$ ion at an impurity concentration of $5\times10^{13}$ to $1.5\times10^{14}$ atoms/cm$^2$ and using about 60 Kev energy. The p-type impurity 13p is introduced by self-alignment with respect to the information storing gate electrode 7 and the controlling gate electrode 9. Then, the impurity introducing mask 31 is removed.

Next, a heat treatment is performed at about 1,000° C. in a nitrogen gas atmosphere, whereby the thus-introduced n-type impurities 11n, 12n and p-type impurity 13p are subjected to stretch-diffusion. By the diffusion of the n-type impurity 12n there can be formed an n-type semiconductor region 12. The n-type semiconductor region 12 is formed at a large junction depth of about 0.5 μm. That is, region 12 extends into the well region 3 from the surface thereof so as to have a junction depth of about 0.5 μm. By the diffusion of the n-type impurity 11n, there can be formed an n$^+$-type semiconductor region 11 of a high impurity concentration. The n$^+$-type semiconductor region 11 is formed to extend into the well region 3 from the surface thereof so as to have a junction depth of about 0.3 μm. By the diffusion of the p-type impurity 13p, there can be formed a p$^+$-type semiconductor region 13 of a high impurity concentration, which is formed at a large junction depth of about 0.3 to 0.5 μm. That is, region 13 extends into the well region 3 from the surface thereof, which surface is at the same level as the major surface of the semiconductor substrate, so as to have a junction depth of about 0.3 to 0.5 μm.

Next, an impurity introducing mask 32 having an opening, wherein the flash type non-volatile memory element Qm is being formed, is formed, for example, by a photoresist film. Thereafter, as shown in FIG. 8, an n-type impurity 14n is introduced mainly in the major surface portion of the p$^+$-type semiconductor region 13, using the impurity introducing mask 32. For example, the n-type impurity 14n is introduced by an ion implantation method using arsenic ion at an impurity concentration of $5\times10^{14}$ to $3\times10^{15}$ atoms/cm$^2$ and using about 60 KeV energy. The n-type impurity 14n is introduced by self-alignment with respect to the information storing gate electrode 7 and the controlling gate electrode 9. As a result of implanting ions of the n-type impurity 14n, there is formed an n-type semiconductor region 14 having a small junction depth of about 0.1 to 0.2 μm. The impurity introducing mask 32 is removed after the introduction of the n-type impurity 14n.

Next, an impurity introducing mask having an opening for the n-channel MISFET Qn is formed (although not shown in the sectional views illustrated). Then, using this impurity introducing mask, an n-type impurity is introduced in the major surface portion of the p-type well region 3, wherein the n-channel MISFET is being formed, to form an n-type semiconductor region 14 of a low impurity concentration for forming an LDD structure. For example, the said n-type impurity is introduced by an ion implantation method using phosphorus ion at a low impurity concentration of about $10^{13}$ atoms/cm$^2$ and using about 50 Kev energy. The thus formed n-type semiconductor region 14 is formed by self-alignment with respect to the gate electrode 9. Thereafter, the impurity introducing mask is also removed.

Next, an impurity introducing mask having an opening for the p-channel MISFET Qp is formed (although not shown in the sectional views illustrated). Using this impurity introducing mask, a p-type impurity is introduced in the major surface portion of the n-type well region 2 to form a p-type semiconductor region 15 of a low impurity concentration for forming an LDD structure. For example, the said p-type impurity is introduced by an ion implantation method using BF$_2$ ion at a low impurity concentration of about $10^{13}$ atoms/cm$^2$ and using about 60 KeV energy. The p-type semiconductor region 15 is formed by self-alignment with respect to the gate electrode 9. Thereafter, this additional impurity introducing mask is removed as shown in FIG. 9.

Then, a side wall spacer 16 is formed on each side wall of the gate electrodes 7 and 9. For example, the side wall spacer 16 can be formed by depositing a silicon oxide film on the whole substrate surface by a CVD method and applying anisotropic etching such as RIE to the whole substrate surface to a degree corresponding to the thickness of the thus-deposited film.

Next, since the major surfaces of the n-type and p-type well regions 2 and 3 are exposed as a result of the above anisotropic etching, those surfaces are subjected to an oxidation treatment to coat them with a thin silicon oxide film.

Then, an impurity introducing mask layer having an opening for the flash type non-volatile memory element Qm and an opening for the n-channel MISFET Qn is formed (although not shown in the illustrations). Using this impurity introducing mask layer, an n-type impurity is introduced in the major surface portion of each region to form an n$^+$-type semiconductor region 17 of a high impurity concentration. For example, the said n-type impurity is introduced by an ion implantation method using arsenic ion at an impurity concentration of about $5\times10^{15}$ atoms/cm$^2$ and using about 60 KeV energy. The n$^+$-type semiconductor region 17 is formed by self-alignment with respect to the gate electrodes 7 and 9 and has a junction depth into the well region 3 of about 0.2 μm. Thereafter, the impurity introducing mask is removed. With this step of forming the n$^+$-type semiconductor region 17, there are completed a field effect transistor serving as the flash type non-volatile memory element Qm and the n-channel MISFET Qn which has a LDD structure.

Figure 10:
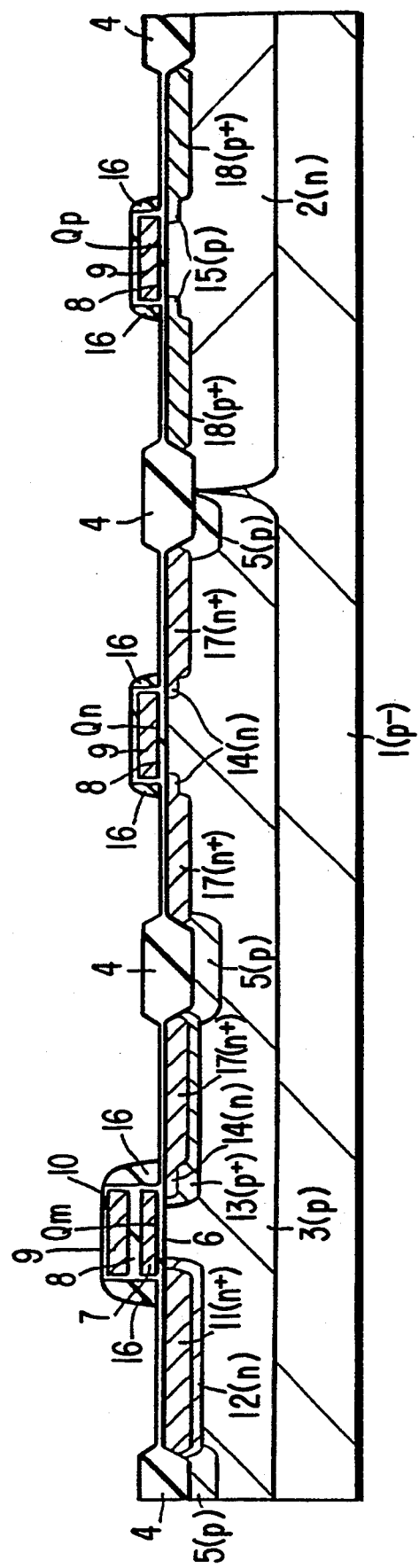

Next, an impurity introducing mask having an opening for the p-channel MISFET Qp is formed. Using this impurity introducing mask, a p-type impurity is introduced in the major surface portion of the p-type semiconductor region 15 to form a p$^+$-type semiconductor region 18 of a high impurity concentration. For example, the said p-type impurity is introduced by an ion implantation method using $BF_2$ ion at a high impurity concentration of about $2\times10^{15}$ atoms/cm$^2$ and using about 60 KeV energy. The p$^+$-type semiconductor region 18 is formed by self-alignment with respect to the gate electrode 9. Thereafter, the impurity introducing mask is removed as shown in FIG. 10. By forming the p$^+$-type semiconductor region 18 there is completed the p-channel MISFET Qp which has a LDD structure.

Next, an inter-layer insulating film 19 is formed on the whole substrate surface. For example, it is formed by a BPSG film deposited according to a CVD method. Then, connection holes (through holes) 20 are formed in the inter-layer insulating film 19 and glass flow is applied to the film 19, thereafter wiring lines 21 associated with a same level wiring layer are formed as shown in FIG. 1. By a series of these manufacturing steps, as described above, there is thus completed the EEPROM of the embodiment exemplified in FIG. 1. Though not shown, a passivation film is provided over the lines 21.

Thus, in the semiconductor integrated circuit device wherein the EEPROM is constituted by non-volatile memory elements, such as the flash type non-volatile memory element Qm in FIG. 1, the impurity concentration of the source region (n$^+$-type semiconductor region 11) of the field effect transistor serving as the flash type non-volatile memory element Qm is made high, while that of the drain region (n-type semiconductor region 14) is made low. By this type of non-volatile memory element construction, there are attained the following effects. (1) Since the surface depletion of the source region in the information erasing operation can be decreased and the surface voltage drop of the same region can thereby be decreased, the amount of tunneling current is correspondingly increased and the information erasing efficiency can thereby be improved. (2) Since the intensity of the induced electric field near the drain region can be reduced and the generation of hot holes and the amount of tunneling current can thereby be correspondingly decreased, the information which may have been previously stored in a flash type non-volatile memory element Qm which is to remain in an unselected state is thus prevented from being erased at the time of information writing operation thereby clearly resulting in an improvement of the electrical reliability associated therewith.

Further, the junction depth of the source region (n$^+$-type semiconductor region 11) of the field effect transistor serving as the flash type non-volatile memory element Qm is made large and that of the drain region (n-type semiconductor region 14) is made small. By this type of construction associated with the source and drain regions thereof, there can be attained the following effects. (3) Since the amount of diffusion of the source region to the channel-forming region side increases and the overlap area of the source region and the information storing gate electrode 7 correspondingly increases to thereby increase the tunneling area, the amount of tunneling current can thus be increased and the information erasing efficiency can thereby be improved. (4) Since it is possible to decrease the amount of diffusion of the drain region to the channel-forming region side and decrease the overlap area of the drain region and the information storing gate electrode, thereby decreasing the coupling capacitance between the drain region and the information storing gate electrode 7, it is possible to prevent an unselected memory cell from inadvertently becoming conductive (switching from its non-conducting to its conducting operating state condition) at the time of information writing operation. Thereby, as a result of such a drain construction, the leakage of current can thus be prevented and the information writing characteristic can be improved.

Moreover, noting that the impurity concentration of the drain region (n-type semiconductor region 14) of the flash type non-volatile memory Qm is made low and the junction depth thereof is made small, whereby the parasitic capacitance added to the data line DL (line 21) can be decreased and the information reading operation can be performed at a higher speed, it thus becomes possible to also attain speed-up of operation.

Further, since the channel length of the flash type non-volatile memory element Qm can be reduced by the fact that the coupling capacitance formed between the drain region of the memory element Qm and the information storing gate electrode 7 can be effectively decreased, it is possible to reduce the memory cell area and thereby attain higher integration.

Further, since the source region and source line can be decreased in resistance value by constituting the source region of the flash type non-volatile memory element Qm high in impurity concentration or large in junction depth, it is possible to effect the information writing, reading and erasing operations stably without any adverse voltage drop or a rise of the source line.

Additionally, in the source region of the flash type non-volatile memory element Qm, the n-type impurity 11n for forming the n$^+$-type semiconductor region 11 of a high impurity concentration and the n-type impurity 12n for forming the n-type semiconductor region 12 of a low impurity concentration are introduced using the same impurity introducing mask 30. Therefore, the number of EEPROM manufacturing steps can be decreased by the step of introducing one impurity.

The EEPROM manufacturing method is not limited to the one described above. There may be adopted any of the following methods.

Method 1

First, after the step shown in FIG. 5, the n-type impurity 12n is introduced in the source region forming area of the flash type non-volatile memory element Qm.

Then, the p- and n-type impurities 13p, 14n are introduced in the drain region forming area of the flash type non-volatile memory element Qm.

Next, the thus-introduced impurities are subjected to stretch-diffusion to form the n-type semiconductor region 12 of a low impurity concentration, the p$^+$-type semiconductor region 13 of a high impurity concentration and the n-type semiconductor region 14 of a low impurity concentration.

Next, the n-type impurity 11n is introduced in the source region forming area of the flash type non-volatile memory element Qm and is then subjected to stretch-diffusion to form the n$^+$-type semiconductor region 11.

Thereafter, through the step shown in FIG. 9 and the subsequent step there is completed the EEPROM.

Method 2

First, after the step shown in FIG. 5, the n-type impurity 12n is introduced in the source region forming area of the flash type non-volatile memory element Qm.

Then, the p-type impurity 13p is introduced in the drain region forming area of the flash type non-volatile memory element Qm.

Next, the thus-introduced impurities are subjected to stretch-diffusion to form the n-type semiconductor region 12 of a low impurity concentration and the $p^+$-type semiconductor region 13 of a high impurity concentration.

Next, the n-type impurity 14n is introduced in the drain region forming area of the flash type non-volatile memory element Qm and than subjected to stretch-diffusion to form the n-type semiconductor region 14 of a low impurity concentration.

Next, the n-type impurity 11n is introduced in the source region forming area of the flash type non-volatile memory element Qm and then subjected to stretch-diffusion to form the $n^+$-type semiconductor region 11.

Thereafter, through the step shown in FIG. 9 and the subsequent step there is completed the EEPROM.

Method 3

First, after the step shown in FIG. 5, the n-type impurity 12n is introduced in the source region forming area of the flash type non-volatile memory element Qm.

Then, the n-type impurity 14n is introduced in the drain region forming area of the flash type non-volatile memory element Qm.

Next, the n-type impurity 11n is introduced in the source region forming area of the flash type non-volatile memory element Qm.

Next, the thus-introduced impurities are subjected to stretch-diffusion to form the n-type semiconductor region 12 of a low impurity concentration, the $n^+$-type semiconductor region 11 of a high impurity concentration and the n-type semiconductor region 14 of a low impurity concentration.

Next, the p-type impurity 13p is introduced in the drain region forming area of the flash type non-volatile memory element Qm and then subjected to stretch-diffusion to form the $p^+$-type semiconductor region 13 of a high impurity concentration.

Thereafter, through the step shown in FIG. 9 and the subsequent step there is completed the EEPROM.

Although the invention accomplished by the present inventors has been described concretely on the basis of the foregoing embodiment, it should be understood that the invention is not to be considered as being limited to the said embodiment but that various modifications thereof as well as alternative embodiments may be implemented in accordance thereof not departing from the spirit and scope of the invention.

For example, the present invention is applicable to an ultraviolet erasing type non-volatile read only memory (EPROM). The flash type non-volatile memory element of the above described EEPROM is constituted by a field effect transistor having an information storing gate electrode and a controlling gate electrode.

The following is a brief summation of the effects and advantages realized by a semiconductor integrated circuit device employing non-volatile memory elements as that described above, such as in connection with the embodiment in FIG. 1, for example, which may be implemented using any one of the alternative techniques described above.

In a semiconductor integrated circuit device having a non-volatile memory circuit, it is possible to improve both the information erasing efficiency and the information writing characteristic.

The electrical reliability of the said semiconductor integrated circuit device can be improved.

Moreover, it is possible to attain speed-up of the operation of the said semiconductor integrated circuit device.

Further, it is possible to attain high integration of the said semiconductor integrated circuit device.

What is claimed is:

1. A method of manufacturing a semiconductor memory device including a memory cell, comprising steps of:

providing a semiconductor substrate of a first conductivity type having a memory cell forming region, with a first gate insulating film formed on said memory cell forming region, a floating gate electrode formed on said first gate insulating film, a second gate insulating film formed on said floating gate electrode, and a control gate electrode formed on said second gate insulating film;

forming a first semiconductor region, of a second conductivity type, in said memory cell forming region by introducing in said memory cell forming region an impurity in self-alignment with one end portion of said control gate electrode, said first semiconductor region extending under said floating gate electrode;

forming a second semiconductor region, of said second conductivity type, in said memory cell forming region by introducing in said memory cell forming region an impurity in self-alignment with another, opposing end portion of said control gate electrode, said first semiconductor region being formed with an impurity concentration higher than an impurity concentration of said second semiconductor region, and said first semiconductor region being formed with a junction depth into said semiconductor substrate greater than a junction depth of said second semiconductor region; and forming a third semiconductor region, of said first conductivity type, in said memory cell forming region by introducing in said memory cell forming region an impurity in self-alignment with said another, opposing portion of said control gate electrode, said third semiconductor region having an impurity concentration higher than an impurity concentration of said semiconductor substrate, and said third semiconductor region being formed with a junction depth into said semiconductor substrate greater than a junction depth of said second semiconductor region, wherein carriers stored in said floating gate electrode are emitted from said floating gate electrode to said first semiconductor region by tunneling through said first gate insulating film.

2. A method of manufacturing a semiconductor memory device according to claim 1, further comprising the steps of:

forming a fourth semiconductor region, of said second conductivity type, in said memory cell forming region by introducing in said memory cell forming region an impurity in self-alignment with said one end portion of said floating gate electrode, said fourth semiconductor region having an impurity concentration lower than an impurity concentration of said first semiconductor region, and said fourth semiconductor region being formed with a junction depth into said semiconductor substrate greater than a junction depth of said first semiconductor region; and after the steps of forming the first, second, third and fourth semiconductor regions, forming side wall spacers on both of opposing, side surfaces of said control and floating gate electrodes in self-alignment with said control and floating gate electrodes, wherein data is written in said memory cell by injecting hot-carriers into said floating gate electrode, and wherein data is erased from said memory cell by emitting said injected carriers from said floating gate electrode to said first semiconductor region by tunneling through said first gate insulating film.

3. A method of manufacturing a semiconductor memory device according to claim 2, further comprising the steps of:

forming a fifth semiconductor region, of said second conductivity type, in said memory cell forming region by introducing in said memory cell forming region an impurity in self-alignment with a corresponding one of said side wall spacers, said fifth semiconductor region having an impurity concentration higher than an impurity concentration of said second semiconductor region, and said fifth semiconductor region being formed with a junction depth into said semiconductor substrate greater than a junction depth of said second semiconductor region.

4. A method of manufacturing a semiconductor memory device according to claim 1, further comprising the steps of:

after the steps of forming the first, second and third semiconductor regions, forming side wall spacers on both of opposing, side surfaces of said control and floating gate electrodes in self-alignment with said control and floating gate electrodes; and forming, adjacent said second semiconductor region, a fourth semiconductor region, of said second conductivity type, in said memory cell forming region by introducing in said memory cell forming region an impurity in self-alignment with a corresponding one of said side wall spacers, said fourth semiconductor region having an impurity concentration higher than an impurity concentration of said second semiconductor region, and said fourth semiconductor region being formed with a junction depth into said semiconductor substrate greater than a junction depth of said second semiconductor region.

5. A method of manufacturing a semiconductor memory device according to claim 1, wherein said first and second conductivity types are p-type and n-type, respectively.

6. A method of manufacturing a semiconductor memory device including a memory cell, comprising steps of:

providing a semiconductor substrate of a first conductivity type having a memory cell forming region, with a first gate insulating film formed on said memory cell forming region, a floating gate electrode formed on said first gate insulating film, a second gate insulating film formed on said floating gate electrode, and a control gate electrode formed on said second gate insulating film;

forming a first semiconductor region, of a second conductivity type, in said memory cell forming region by introducing in said memory cell forming region an impurity in self-alignment with one end portion of said control gate electrode, said first semiconductor region extending under said floating gate electrode;

forming a second semiconductor region, of said second conductivity type, in said memory cell forming region by introducing in said memory cell forming region an impurity in self-alignment with another, opposing end portion of said control gate electrode, said first semiconductor region having an impurity concentration higher than an impurity concentration of said second semiconductor region, and said first semiconductor region being formed with a junction depth into said semiconductor substrate greater than a junction depth of said second semiconductor region; and forming a third semiconductor region, of said second conductivity type, in said memory cell forming region by introducing in said memory cell forming region an impurity in self-alignment with said one end portion of said floating gate electrode, said third semiconductor region having an impurity concentration lower than an impurity concentration of said first semiconductor region, and said third semiconductor region being formed with a junction depth into said semiconductor substrate greater than a junction depth of said first semiconductor region, wherein carriers stored in said floating gate electrode are emitted from said floating gate electrode to said first semiconductor region by tunneling through said first gate insulating film.

7. A method of manufacturing a semiconductor memory device according to claim 6, further comprising the steps of:

after the steps of forming first, second and third semiconductor regions, forming side wall spacers on both of opposing, side surfaces of said control and floating gate electrodes in self-alignment with said control and floating gate electrodes, and forming, adjacent said second semiconductor region, a fourth semiconductor region, of said second conductivity type, in said memory cell forming region by introducing in said memory cell forming region an impurity in self-alignment with one of said side wall spacers, said fourth semiconductor region being formed with an impurity concentration higher than an impurity concentration of said second semiconductor region, and said fourth semiconductor region being formed with a junction depth into said semiconductor substrate greater than a junction depth of said second semiconductor region, wherein data is written in said memory cell by injecting hot-carriers into said floating gate electrode, wherein data is erased from said memory cell by emitting said injected carriers from said floating gate electrode to said first semiconductor region by tunneling through said first gate insulating film, and wherein said first and second conductivity types are p-type and n-type, respectively.

8. A method of manufacturing a semiconductor memory device including a memory cell and an MISFET for a peripheral circuit, comprising the steps of:

providing a semiconductor substrate of a first conductivity type having a memory cell forming region and a peripheral circuit forming region, with a first gate insulating film formed on said memory cell forming region, a floating gate electrode formed on said first gate insulating film, a second gate insulating film formed on said floating gate electrode, a control gate electrode formed on said second gate insulating film, and with a third gate insulating film formed on said peripheral circuit forming region, a first gate electrode of said MISFET formed on said third gate insulating film;

forming a first semiconductor region, of a second conductivity type, in said memory cell forming region, by introducing in said memory cell forming region an impurity in self-alignment with one end portion of said control gate electrode, said first semiconductor region extending under said floating gate electrode;

forming a second semiconductor region, of said second conductivity type, in said memory cell forming region, by introducing in said memory cell forming region an impurity in self-alignment with another, opposing end portion of said control gate electrode, said first semiconductor region being formed with an impurity concentration higher than an impurity concentration of said second semiconductor region, and said first semiconductor region being formed with a junction depth into said semiconductor substrate greater than a junction depth of said second semiconductor region;

forming a third semiconductor region, of said second conductivity type, in said peripheral circuit forming region, by introducing in said peripheral circuit forming region an impurity in self-alignment with said first gate electrode, said first semiconductor region being formed with an impurity concentration higher than an impurity concentration of said third semiconductor region;

after the steps of forming first, second and third semiconductor regions, forming first side wall spacers on both of opposing, side surfaces of said control and floating gate electrodes in self-alignment with said control and floating gate electrodes, and forming second side wall spacers on both of opposing, side surfaces of said first gate electrode in self-alignment with said first gate electrode; and forming, adjacent said third semiconductor region, a fourth semiconductor region, of said second conductivity type, in said peripheral circuit forming region by introducing in said peripheral circuit forming region an impurity in self-alignment with a corresponding one of said second side wall spacers, said fourth semiconductor region being formed with an impurity concentration higher than an impurity concentration of said third semiconductor region, said fourth semiconductor region being formed with a junction depth into said semiconductor substrate greater than a junction depth of said third semiconductor region, and said third and fourth semiconductor regions serve as a drain region of said MISFET, wherein carriers stored in said floating gate electrode are emitted from said floating gate electrode to said first semiconductor region by tunneling through said first gate insulating film.

9. A method of manufacturing a semiconductor memory device according to claim 8, further comprising the step of:

before the step of forming said first and second side wall spacers, forming a fifth semiconductor region, of said first conductivity type, in said memory cell forming region by introducing in said memory cell forming region an impurity in self-alignment with said another, opposing end portion of said control gate electrode, said fifth semiconductor region being formed with an impurity concentration higher than an impurity concentration of said semiconductor substrate, and said fifth semiconductor region being formed with a junction depth into said semiconductor substrate greater than a junction depth of said second semiconductor region.

10. A method of manufacturing a semiconductor memory device according to claim 9, further comprising the step of:

before the step of forming said first and second side wall spacers, forming a sixth semiconductor region, of said second conductivity type, in said memory cell forming region by introducing in said memory cell forming region an impurity in self-alignment with said one end portion of said floating gate electrode, said sixth semiconductor region being formed with an impurity concentration lower than an impurity concentration of said first semiconductor region, and said sixth semiconductor region being formed with a junction depth greater than a junction depth of said first semiconductor region, wherein data is written in said memory cell by injecting hot-carriers into said floating gate electrode, and wherein data is erased from said memory cell by emitting said injected carriers from said floating gate electrode to said first semiconductor region by tunneling through said first gate insulating film.

11. A method of manufacturing a semiconductor memory device according to claim 10, wherein in the step of forming said fourth semiconductor region said impurity is introduced in both said peripheral circuit forming region and said memory cell forming region and is introduced in said memory cell forming region in self-alignment with a corresponding one of said first side wall spacers to form a seventh semiconductor region of said second conductivity type, said seventh semiconductor region being formed with an impurity concentration higher than an impurity concentration of said second semiconductor region, and said seventh semiconductor region being formed with a junction depth into said semiconductor substrate greater than a junction depth of said second semiconductor region.

12. A method of manufacturing a semiconductor memory device according to claim 9, wherein in the step of forming said fourth semiconductor region said impurity is introduced in both said peripheral circuit forming region and said memory cell forming region and is introduced in said memory cell forming region in self-alignment with a corresponding one of said first side wall spacers to form a sixth semiconductor region of said second conductivity type, said sixth semiconductor region being formed with an impurity concentration higher than an impurity concentration of said second semiconductor region, and said sixth semiconductor region being formed with a junction depth into said semiconductor substrate greater than a junction depth of said second semiconductor region.

13. A method of manufacturing a semiconductor memory device according to claim 9, wherein an impurity concentration of said second semiconductor region is higher than an impurity concentration of said third semiconductor region.

14. A method of manufacturing a semiconductor memory device according to claim 8, further comprising the step of:

before the step of forming said first and second side wall spacers, forming a fifth semiconductor region, of said second conductivity type, in said memory cell forming region by introducing in said memory cell forming region an impurity in self-alignment with said one end portion of said floating gate electrode, said fifth semiconductor region being formed with an impurity concentration lower than an impurity concentration of said first semiconductor region, and said fifth semiconductor region being formed with a junction depth into said semiconductor substrate greater than a junction depth of said first semiconductor region.

15. A method of manufacturing a semiconductor memory device according to claim 14, wherein in the step of forming said fourth semiconductor region said impurity is introduced in both said peripheral circuit forming region and said memory cell forming region and is introduced in said memory cell forming region in self-alignment with a corresponding one of said first side wall spacers to form a sixth semiconductor region of said second conductivity type, said sixth semiconductor region being formed with an impurity concentration higher than an impurity concentration of said second semiconductor region, and said sixth semiconductor region being formed with a junction depth into said semiconductor substrate greater than a junction depth of said second semiconductor region.

16. A method of manufacturing a semiconductor memory device according to claim 8, wherein in the step of forming said fourth semiconductor region said impurity is introduced in both said peripheral circuit forming region and said memory cell forming region and is introduced in said memory cell forming region in self-alignment with a corresponding one of said first side wall spacers to form a fifth semiconductor region of said second conductivity type, said fifth semiconductor region being formed with an impurity concentration higher than an impurity concentration of said second semiconductor region, and said fifth semiconductor region being formed with a junction depth into said semiconductor substrate greater than a junction depth of said second semiconductor region.

17. A method of manufacturing a semiconductor memory device according to claim 8, wherein an impurity concentration of said second semiconductor region is higher than an impurity concentration of said third semiconductor region.

18. A method of manufacturing a semiconductor memory device according to claim 8, wherein said first and second conductivity types are p-type and n-type, respectively.

* * * * *